United States Patent [19]

Yoshimura et al.

[11] Patent Number: 5,170,241

[45] Date of Patent: Dec. 8, 1992

[54] METAL INSULATOR SEMICONDUCTOR TRANSISTOR HAVING GUARD REGION AND SEMICONDUCTOR DEVICE HAVING THE SAME

[75] Inventors: Kazuhiro Yoshimura; Shuichi Suzuki, both of Kawasaki, Japan

[73] Assignee: Fujitsu Limited, Kawasaki, Japan

[21] Appl. No.: 623,295

[22] Filed: Dec. 6, 1990

[30] Foreign Application Priority Data

Dec. 8, 1989 [JP] Japan .................................. 1-319826

[51] Int. Cl.⁵ .................... H01L 29/34; H01L 29/68; H01L 29/78
[52] U.S. Cl. .................................... 259/339; 257/488
[58] Field of Search ................. 357/52, 47, 53, 23.11, 357/23.4, 23.8

[56] References Cited

U.S. PATENT DOCUMENTS

| | | | |
|---|---|---|---|
| 4,009,483 | 2/1977 | Clark | 357/52 |
| 4,468,686 | 8/1984 | Rosenthal | 357/53 |
| 4,567,502 | 1/1986 | Nakagawa et al. | 357/53 |
| 4,602,266 | 7/1986 | Coe | 357/20 |
| 4,866,495 | 9/1989 | Kinzer | 357/52 |
| 4,974,061 | 11/1990 | Torikai | 357/52 |
| 4,982,245 | 1/1991 | Hanaoka et al. | 357/52 |

Primary Examiner—Jerome Jackson, Jr.
Assistant Examiner—D. Monin
Attorney, Agent, or Firm—Staas & Halsey

[57] ABSTRACT

A field effect transistor includes a semiconductor substrate having a first conduction type and functioning as a drain of the field effect transistor, and a back gate region formed in the semiconductor substrate and having a second conduction type opposite to the first conduction type. The field effect transistor also includes a source region formed in the back gate region and having the first conduction type, an insulator film formed on the semiconductor substrate and having first and second windows, and a gate electrode covered by the insulator film and located so that a channel is formed in the back gate region. Further, the field effect transistor includes a guard region formed in the semiconductor substrate and located close to the back gate region. The guard region has the second conduction type, and has a first portion located on a first side of the guard region facing the back gate region and a second portion located on a second side opposite to the first side. A first breakdown voltage obtained at a first junction between the second portion and the semiconductor substrate is lower than that obtained at a second junction between the back gate region and the semiconductor substrate. Furthermore, the field effect transistor includes an electrode formed on the insulator film and connecting the guard region and the back gate region via the first and second windows.

15 Claims, 6 Drawing Sheets

MOSFET

FIG. 3B
PRIOR ART

MOSFET

METAL INSULATOR SEMICONDUCTOR TRANSISTOR HAVING GUARD REGION AND SEMICONDUCTOR DEVICE HAVING THE SAME

BACKGROUND OF THE INVENTION

The present invention generally relates to a metal insulator semiconductor field effect transistor, and more particularly to a vertical type metal insulator semiconductor field effect transistor having a high drivability, such as a power metal oxide semiconductor (MOS) field effect transistor (FET). Further, the present invention is concerned with a semiconductor device having such field effect transistors.

Figure 1:
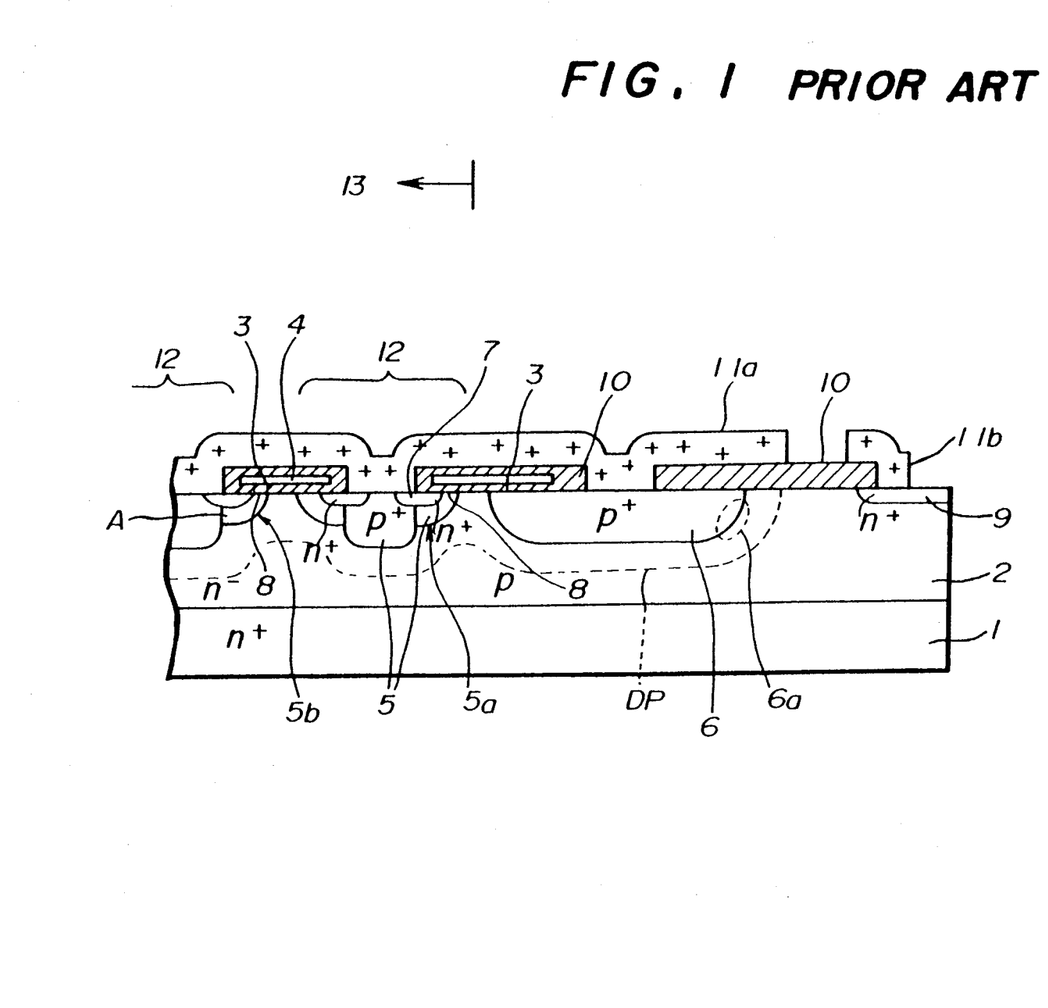
FIG. 1 is a cross-sectional view of a conventional power MOSFET.

Recently, power MOSFETs have been used for controlling motors and switching power sources which need a large amount of current. Referring to FIG. 1, there is illustrated a conventional vertical type power MOSFET used for controlling a large amount of current. The power MOSFET in FIG. 1 has an $n^+$-type silicon substrate 1 and a silicon epitaxial layer 2 functioning as a drain region. A back gate region 5 having portions of the $p^+$ type or p-type is formed in the epitaxial region 5. A source region 7 of the $n^+$-type (which has two portions in its cross section) is formed in the back gate region 5. A channel 8 is formed on a surface portion of the back gate region 5 located between a portion of the silicon epitaxial layer 2 under a gate oxide film 3 and a portion of the source region 7. The gate oxide film 3 is completely covered by an insulation film 10. The channel length is equal to a difference between the diffusion distances of the back gate region 5 and the source region 7 in the transversal direction. Hereafter, the above-mentioned structure is referred to as a cell 12, and a region in which a number of cells 12 are arranged close to each other is referred to as an operation area 13. The back gate region 5 is electrically connected to the source region 7 via a source electrode 11a, and is fixed to a potential of the source electrode 11a.

The source electrode 11a also functions as a field electrode. A polarity reverse preventing region 9 of the $n^+$-type for preventing the polarity of the epitaxial layer 2 from reversing is provided so that it surrounds a guard ring region 6. An equal potential electrode 11b is electrically connected to the polarity reverse preventing region 9.

Figure 2:
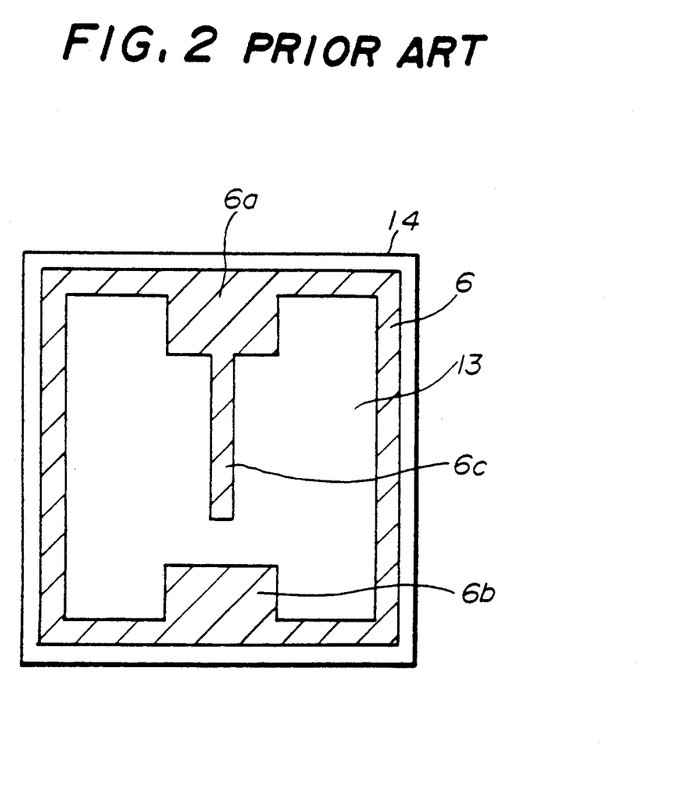
FIG. 2 is a plan view of a chip on which power MOSFETs are formed.

In order to enhance the maximum driving voltage of the above power MOSFET, an arrangement shown in FIG. 2 is employed. The $p^+$-type guard ring region 6 is provided in peripheral portions of a semiconductor chip 14 so that it surrounds the operation area 13. As shown in FIG. 1, impurities of the guard ring region 6 are deeply diffused into the epitaxial layer 2. A peripheral portion 6a of the guard ring region 6 has a small curvature. The guard ring region 6 is electrically connected to the source region 7 by the source electrode 11a.

It is impossible to form the back gate region 5 deeply in the epitaxial layer 2 with respect to the channel length. Thus, a peripheral portion of a PN junction between the back gate region 5 and the epitaxial layer 2 has a large curvature. As a result, it is very difficult to obtain a large breakdown voltage. The guard ring region 6 is provided for the purpose of increasing the breakdown voltage of the power MOSFET shown in FIG. 1. When a reverse voltage is applied between the source region 7 and the drain region 2, the electric field of a depletion layer DP illustrated by the broken line in FIG. 1 extends from the PN junction around the guard ring region 6 to the operation area 13. This electric field functions to reduce the electric field extending from the PN junctions in the cells 12 to the guard ring region 6. Thereby, it becomes difficult for the avalanche breakdown to occur in the PN junctions of the cells 12, so that the breakdown voltage of the power MOSFET is increased.

As shown in FIG. 2, $p^+$-type regions 6a, 6b and 6c are formed under gate pads, source pads and electrodes for sending signals applied to gate pads to the gate electrodes 4 of the cells 12. These $p^+$-type regions 6a, 6b and 6c function to reduce parasitic capacitances between the epitaxial layer 2 and the above pads or electrodes, so that currents are caused to uniformly pass through an entire chip.

The conventional layer structure shown in FIG. 1 is capable of preventing the avalanche breakdown from occurring at a peripheral portion 5a of the PN junction between the guard ring region 6 and the epitaxial layer 2. However, there is a problem in which the avalanche breakdown is liable to take place at an internal portion 5b of the PN junction between the guard ring region 6 and the epitaxial layer 2. That is, it is difficult for the cells 12 located at the peripheral portion of the operation area 13 to be broken, and on the other hand, it is easy for the cells 12 located at an inner portion of the operation area 13 to be broken.

When the power MOSFETs, each having the structure shown in FIG. 1, are used for controlling the drive of a motor, a flyback voltage resulting from an inductance of a coil of the motor is applied to the cells 12, each cell having a small area. Then, almost all of flyback energy is consumed in the cells 12. Each of the cells 12 has a small breakdown voltage. In addition, during this operation, a parasitic transistor formed by the epitaxial layer 2, the back gate region 5 and the source region 7, is operating. Thus, a thermal runaway will occur in some of the power MOSFETs, and they will be easily damaged.

Figure 3A:
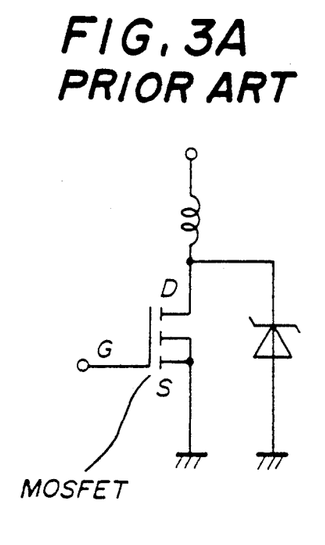
FIGS. 3A and 3B are circuit diagrams illustrating a conventional arrangement provided for the purpose of preventing avalanche breakdown from occurring in the power MOSFET.
Figure 3B:
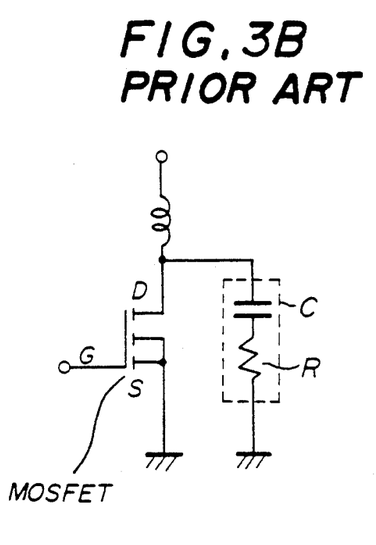

Conventionally, in order to eliminate the above problem, as shown in FIG. 3A, a clamp diode which has an avalanche breakdown voltage lower than that of the power MOSFET is externally connected. Alternatively, as shown in FIG. 3B, a series circuit of a capacitor C and a resistor R is externally connected between the source and drain of the power MOSFET. The clamp diode in FIG. 3A and the series circuit in FIG. 3B absorb the flyback energy and protect the power MOSFETs.

However, the structures shown in FIGS. 3A and 3B need an increased number of structural parts electrically connected to the power MOSFET and increase the production cost of application circuit devices. Further, a large sized chip will be needed to form the clamp diode or the series circuit if they are formed on the chip. This also increases the production cost.

SUMMARY OF THE INVENTION

It is a general object of the present invention to provide an improved power field effect transistor in which the above-mentioned disadvantages are eliminated.

A more specific object of the present invention is to provide a power field effect transistor in which an increased breakdown voltage is realized without increasing the chip size.

The above-mentioned objects of the present invention are achieved by a field effect transistor comprises a semiconductor substrate having a first conduction type and functioning as a drain of the field effect transistor, and a back gate region formed in the semiconductor substrate and having a second conduction type opposite to the first conduction type. The field effect transistor also comprises a source region formed in the back gate region and having the first conduction type, an insulator film formed on the semiconductor substrate and having first and second window, and a gate electrode covered by the insulator film and located so that a channel is formed in the back gate region. Further, the field effect transistor comprises a guard region formed in the semiconductor substrate and located close to the back gate region. The guard region has the second conduction type, and has a first portion located on a first side of the guard region facing the back gate region and a second portion located on a second side opposite to the first side. A first breakdown voltage obtained at a first junction between the second portion and the semiconductor substrate is lower than that obtained at a second junction between the back gate region and the semiconductor substrate. Furthermore, the field effect transistor comprises an electrode formed on the insulator film and connecting the guard region and the back gate region via the first and second windows.

Another object of the present invention is to provide a semiconductor device using the above-mentioned transistors (cells).

This object of the present invention is achieved by a semiconductor device comprising a semiconductor substrate having a first conduction type; an operation area defined on the semiconductor substrate and having an array of a plurality of cells, each of the cells including a back gate region formed in the semiconductor substrate and having a second conduction type opposite to the first conduction type, a source region formed in the back gate region and having the first conduction type, an insulator film formed on the semiconductor substrate and having first and second window, and a gate electrode covered by the insulator film and located so that a channel is formed in the back gate region, the semiconductor substrate functioning as drains of the cells; a guard region formed in the semiconductor substrate and located close to the array, the guard region having the second conduction type and having a first portion located on a first side of the guard region facing the array and a second portion located on a second side opposite to the first side, a first breakdown voltage obtained at a first junction between the second portion and the semiconductor substrate being lower than that obtained at a second junction between the back gate region and the semiconductor substrate of each of the cells; and an electrode formed on the insulator film of each of the cells and connecting the guard region and the back gate region of each of the cells via the first and second windows.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

A description will now be given of the first preferred embodiment of the present invention with reference to FIG. 4. A power MOSFET shown in FIG. 4 has an n+-type silicon substrate 15, and an n−-type silicon epitaxial layer 16 formed thereon. The silicon substrate 15 and the epitaxial layer 16 form a semiconductor substrate 29. The epitaxial layer 16 forms a drain region. The relative resistance of the epitaxial substrate 16 is approximately 1 $\Omega$cm, and the thickness thereof is approximately 10 $\mu$m. A cell 26 which has a square plan area having a size of about 20 $\mu$m × 20 $\mu$m is formed on the epitaxial layer 16. A large number of such cells 26 are arranged in an operation area 27 at intervals equal to approximately 20 $\mu$m. Each cell 26 has a back gate area 19 and a source region 21. The back gate area 19 has a p+-type center portion 19a which is approximately 5 $\mu$m depth, and a p-type peripheral portion 19b which is approximately 3 $\mu$m depth and which surrounds the p+-type center portion 19a. The source region 21 is an n+-type region and is approximately 1.5 $\mu$m in depth. It will be noted that the conduction type of the back gate region 19 is opposite to that of the source region 21.

A gate oxide film 17 is formed on the epitaxial layer 16, and a gate electrode 18 which is formed of a polysilicon layer is formed on the gate oxide film 17. The gate oxide film 17 has a thickness of about 800 angstroms, and the gate electrode 18 is formed of an n+-type polysilicon layer and has a thickness of about 5000 angstroms. Windows are formed in the gate oxide film 17. Boron impurities are introduced in the epitaxial layer 16 via the windows by an ion implantation process, so that the back gate regions 19 are formed. Arsenic impurities are introduced in the epitaxial layer 16 via the same windows used in the ion implantation process, so that the source regions 21 are formed. The length of a channel region (hereafter simply referred to as a channel) 22 is equal to the difference, in the transversal direction, between the diffused distance of the back gate region 19 and the source region 21 immediately under the gate oxide film 17.

An electric field forming the channel 22 is applied to a portion between the gate electrode 18 and the back gate region 19. The back gate region 19 and the source region 21 are short-circuited via a source electrode 25a formed of aluminum. Thus, the potential of the back gate region 19 is fixed so that it is equal to the potential of the source region 21. In the operation area 27, a plurality of cells 26 are arranged close to each other, and connected in parallel to each other via the source electrode 25a.

In order to relax the electric field of a depletion region extending from the cells 26 located at the peripheral area of the operation area 27, a guard ring region 20 is formed outside of the operation area 27. For example, the guard ring region 20 completely surrounds the operation area 27, as shown in FIG. 5. It is also possible to arrange the guard ring region 20 so that it partially surrounds the operation area 27.

The guard ring region 20 is composed of a p+-type region 20a and a p+-type breakdown adjustment region 20b. The breakdown voltage adjustment region 20b partially overlaps with the p+-type region 20a at an outer portion of the p+-type region 20a. The p+-type region 20a is located closer to the cells 26 than the breakdown voltage adjustment region 20b, and on the other hand, the breakdown voltage adjustment region 20b is located closer to the edge of a chip 28 (FIG. 5) than the p+-type region 20a.

The guard ring region 20 is formed by, for example, a thermal diffusion process. Normally, as the depth of a diffusion region increases, the curvature of a peripheral portion of the diffusion region increases. As the curvature of the PN junction increases, the breakdown voltage decreases. The guard ring region 20 is designed with the above facts in mind.

The p+-type region 20a close to the operation region 27 is deeper than that of the breakdown voltage adjustment region 20b. For example, the p+-type region 20a is approximately 5 μm deep, while the breakdown voltage adjustment region 20b is approximately 2.5 μm deep. The depth of the breakdown voltage adjustment region 20b is adjusted so that the breakdown voltage of the interface between the breakdown voltage adjustment region 20b and the epitaxial layer 16 is smaller than that of the interface between the back gate region 19 of each cell 26 in the operation area 27 and the epitaxial layer 16. Instead of adjusting the depth of the breakdown voltage adjustment region 20b, or in addition thereto, it is also possible to adjust the dose of impurities therein. Since the guard ring region 20 is connected to the source electrode 25a, a diode formed by a PN junction between the breakdown voltage adjustment region 20b and the epitaxial layer 16 is connected to the source and the drain of each cell (transistor) 26.

Figure 4:
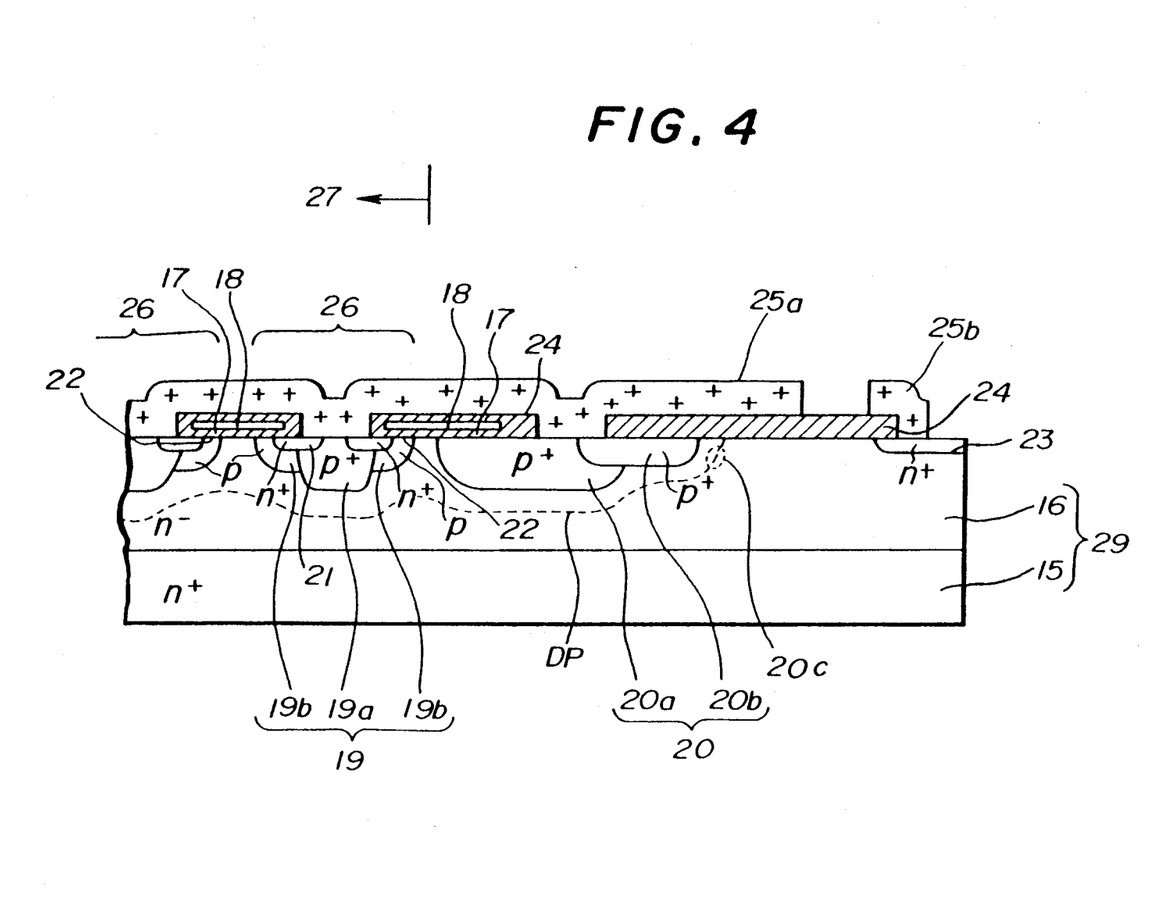
FIG. 4 is a cross-sectional view of a MOSFET according to a first preferred embodiment of the present invention.
Figure 5:
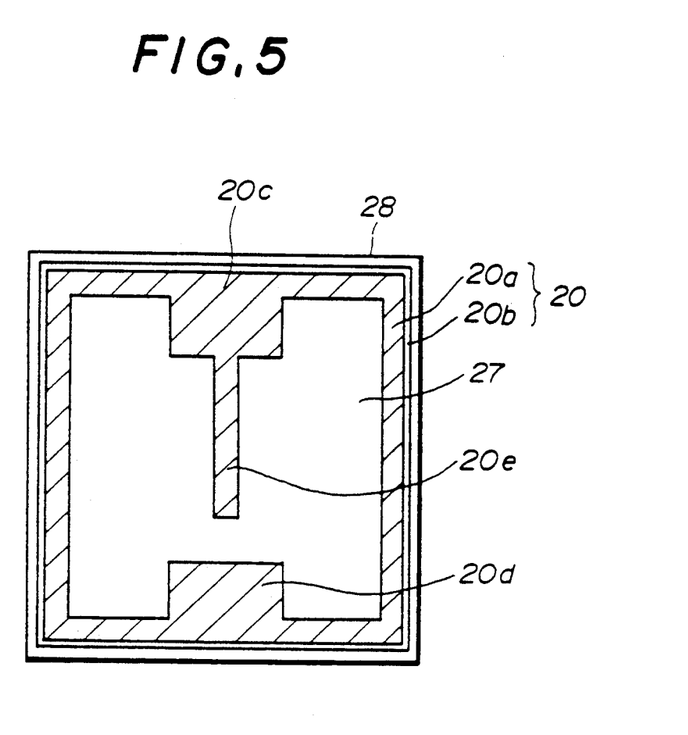
FIG. 5 is a plan view of a chip on which power MOSFETs according to the present invention are formed.
Figure 6:
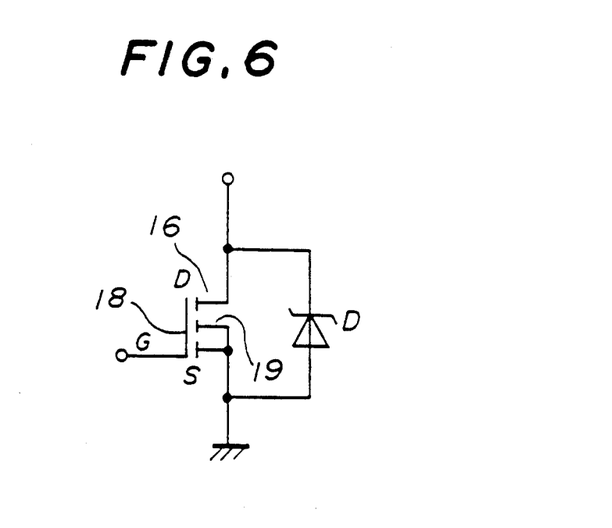
FIG. 6 is a circuit diagram of the MOSFET shown in FIG. 4.

FIG. 6 is a circuit diagram of the power MOSFET having the structure shown in FIG. 4. The above-mentioned diode labeled D is connected between the source and drain of the power MOSFET. It should be noted that the diode D is formed on the chip 28 (FIG. 5).

Turning to FIG. 4, the source electrode 25 also functions as a field electrode, which prevents the influence of contamination by ions entering through the surface of the chip 28 and prevents a reverse layer from being formed in the semiconductor substrate 29. Further, the source electrode 25a generates an electric field which functions to relax the electric field around the PN junction having the peripheral portion of the guard ring region 20, so that the breakdown voltage is increased. At the peripheral portion of the chip 28, there are provided an n+-type polarity reverse preventing region 23, and an equal potential electrode 25b, which are provided for preventing the polarity reverse of the epitaxial layer 16. An insulator film 24 made of, for example, SiO$_2$, is formed on the surface of the semiconductor substrate 29. The insulator film 24 has windows into which the source electrode 25a is filled. As shown in FIG. 5, p+-type regions 20c, 20d and 20e are respectively formed under gate pads, source pads and electrodes for sending signals applied to gate pads to the gate electrodes 18 of the cells 26. These p+-type regions 20c, 20d and 20e function to reduce parasitic capacitances formed between the epitaxial layer 16 and the above pads or electrodes.

Since the p+-type region 20a close to the operation area 27 is formed deep in the epitaxial layer 16, it is possible to considerably relax the electric field extending from the PN junctions of the cells 26 at the periphery of the operation area 27. In addition, since the breakdown voltage adjustment region 20b formed on the outer portion side of the p+-type region 20a is formed shallowly, a portion 20c of the PN junction between the breakdown voltage adjustment region 20b and the epitaxial layer 16 has a large curvature. A depletion layer is indicated in FIG. 4 by the broken line DP. As the result of the above, the breakdown voltage of the portion 20c is lower than that of each cell 26 in the operation area 27. Further, since the guard ring region 20 is connected to the source electrode 25a, as shown in FIG. 6, the diode D formed of the PN junction of the breakdown voltage adjustment region 20b and the epitaxial layer 16 is connected between the source and drain. Thus, when the aforementioned flyback voltage is reversely applied between the source and drain of the power MOSFET used in an application circuit having an inductive load, avalanche breakdown will first occur at the portion 20c of the PN junction, so that the cells 26 can be protected from the flyback voltage.

In accordance with the present invention, it becomes possible to increase the breakdown voltage of the power MOSFET without increasing the chip size or using the protection circuit provided outside of the power MOSFET chip.

Figure 7:
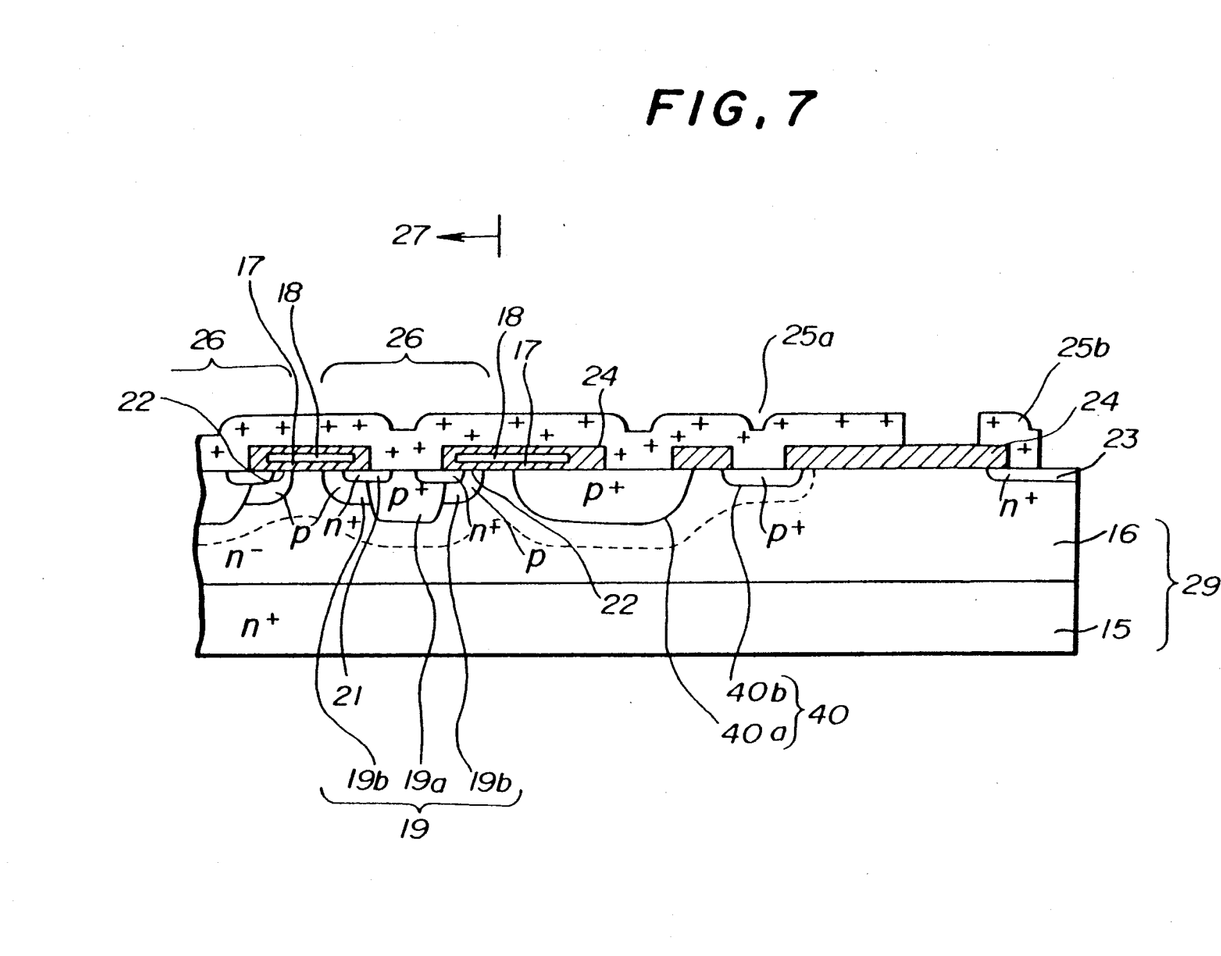
FIG. 7 is a cross-sectional view of a MOSFET according to a second preferred embodiment of the present invention.

A description will now be given of a second embodiment of the present invention with reference to FIG. 7, in which those parts which are the same as those shown in FIG. 4 are given the same reference numerals. A guard ring region 40 consists of a p+-type region 40a and a p+-type breakdown voltage adjustment area 40b. It should be noted that the breakdown voltage adjustment area 40b is formed separately from the p+-type region 40a and located outside thereof. The breakdown voltage adjustment area 40b is shallower than the p+-type region 40a. The source electrode 25a electrically connects the p+-type region 40a and the breakdown voltage adjustment area 40b via a window formed in the insulator film 24. The broken line DP in FIG. 7 indicates a depletion layer. The curvature of the PN junction between the breakdown voltage adjustment region 40b and the epitaxial layer 16 is smaller than that of the PN junction between the p+-type region and the epitaxial layer 16. When an excessive reverse voltage is applied between the source and drain, the breakdown voltage adjustment region 40b will first be broken, so that the cells 26 are protected therefrom. Instead of adjusting the depth of the breakdown voltage adjustment region 40b, or in addition thereto, it is possible to adjust the dose of impurities in the breakdown voltage adjustment region 40b.

It is possible to form a P-channel power MOSFET by reversing the polarities of the elements shown in FIGS. 4 and 6.

The present invention is not limited to the aforementioned embodiments, and variations and modifications may be made without departing from the scope of the present invention.

What is claimed is:

1. A field effect transistor comprising:

a semiconductor substrate having a first conduction type and functioning as a drain region of said field effect transistor;

a back gate region formed in said semiconductor substrate and having a second conduction type opposite to said first conduction type;

a source region formed in said back gate region and having the first conduction type;

an insulator film formed on said semiconductor substrate and having first an second windows, said first window being located at a portion of the insulator film where said back gate region and said source region are adjacent to each other at a surface portion of said semiconductor substrate and are exposed via said first window;

a gate electrode covered by said insulator film and located above a surface portion of said back gate region between said source region and said drain region, said surface portion of said back gate region functioning as a channel;

a guard region formed in said semiconductor substrate and located close to said back gate region, said guard region having the second conduction type and having a first portion located on a first side of said guard region facing said back gate region and a second portion located on a second side opposite to said first side, said the first portion being formed deeper in said semiconductor substrate than said second portion, a first breakdown voltage obtained at a first junction between said second portion and said semiconductor substrate being lower than that obtained at a second junction between said back gate region and said semiconductor substrate, said second window being located on an outer surface portion of said first portion closer to said second portion that said back gate region, and said second window exposing a part of said first portion; and an electrode formed on said insulator film and connecting said back gate region and said guard region via said first and second windows.

2. A field effect transistor as claimed in claim 1, wherein said first portion and said second portion are formed to contact with each other.

3. A field effect transistor as claimed in claim 1, wherein said guard region is formed so that said guard region completely surrounds said back gate region.

4. A field effect transistor as claimed in claim 1, wherein said guard region is formed so that said guard region partially surrounds said back gate region.

5. A field effect transistor as claimed in claim 1, wherein:

said second portion of the guard region has a first curvature;

said back gate region has a second curvature; and said first curvature is smaller than said second curvature.

6. A field effect transistor as claimed in claim 1, wherein:

said second portion of said guard region is formed so as to be spaced apart from said first portion;

said insulator film has a third window located on a center portion of said second portion;

said first portion of the guard region is connected to said back gate region via said first and second windows; and said second portion of the guard region is connected to said back gate region via said first and third windows.

7. A field effect transistor as claimed in claim 1, wherein said second portion of the guard region having the second conduction type and the substrate form a junction which functions as a diode.

8. A semiconductor device comprising:

a semiconductor substrate having a first conduction type;

an operation area defined on said semiconductor substrate and having an array of a plurality of cells, each of the cells including a back gate region formed in said semiconductor substrate and having a second conduction type opposite to said first conduction type, a source region formed in said back gate region and having the first conduction type, an insulator film formed on said semiconductor substrate and having first and second windows, said first window being located at a portion of said insulator film where said back gate region and said source region are adjacent to each other at a surface portion of said semiconductor substrate and are exposed via said first window, and a gate electrode covered by said insulator film and located above a surface portion of said back gate region between said source region and said drain region, said surface portion of said back gate region functioning as a channel, and said semiconductor substrate functioning as drains of said cells;

a guard region formed in said semiconductor substrate and located close to said array, said guard region having the second conduction type and having a first portion located on a first side of said guard region facing said array and a second portion located on a second side opposite to said first side, said first portion being formed deeper in the semiconductor substrate than said second portion, a first breakdown voltage obtained at a first junction between said second portion and said semiconductor substrate being lower than that obtained at a second junction between said back gate region and said semiconductor substrate of each of said cells, said second window being located on an outer surface portion of said first portion closer to said second portion than said back gate region, and said second window exposing a part of said first portion; and an electrode formed on said insulator film of each of said cells and connecting said back gate region and said guard region of each of said cells via said first and second windows.

9. A semiconductor device as claimed in claim 8, wherein said guard region is formed so that said guard region completely surrounds said array.

10. A semiconductor device as claimed in claim 8, wherein said guard region is formed so that said guard region partially surrounds said array.

11. A semiconductor device as claimed in claim 8, wherein said first portion and said second portion are formed to contact with each other.

12. A semiconductor device as claimed in claim 8, wherein:

said second portion of the guard region has a first curvature;

said back gate region has a second curvature; and said first curvature is smaller than said second curvature.

13. A semiconductor device as claimed in claim 8, wherein:
said second portion of said guard region is formed so as to be spaced apart from said first second portion;
said insulator film has a third window located on a center portion of said second portion;
said first portion of the guard region is connected to said back gate region via said first and second windows; and
said second portion of the guard region is connected to said back gate region via said first and third windows.

14. A semiconductor device as claimed in claim 8, wherein said second portion of the guard region having the second conduction type and the substrate form a junction which functions as a diode.

15. A semiconductor device comprising:
a semiconductor substrate having a first conduction type and functioning as a drain region of said semiconductor device;
a back gate region formed in said semiconductor substrate and having a second conduction type opposite to said first conduction type;
a source region formed in said back gate region and having the first conduction type;
a guard region formed in said semiconductor substrate, having the second conduction type and having a first portion located on a first side of said guard region facing said back gate region and a second portion located on a second side opposite to said first side, the first portion having a first depth and the second portion having a second depth less the first depth;
an insulator film having a first window communicating with said source region, a second window communicating with a part of the first portion which is closer to the second portion than said back gate region, ad a third window communicating approximately with a center part of the second portion; and
an electrode coupled to the source region, the first portion and the second portion via the first, second and third windows.

* * * * *